(12) United States Patent
Shirasaki et al.

(10) Patent No.: US 11,177,108 B2
(45) Date of Patent: Nov. 16, 2021

(54) CHARGED PARTICLE BEAM APPLICATION APPARATUS

(71) Applicant: Hitachi High-Tech Corporation, Tokyo (JP)

(72) Inventors: Yasuhiro Shirasaki, Tokyo (JP); Takashi Dobashi, Tokyo (JP); Momoyo Enyama, Tokyo (JP); Akira Ikegami, Tokyo (JP); Yuta Kawamoto, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/979,952

(22) PCT Filed: Mar. 30, 2018

(86) PCT No.: PCT/JP2018/013901
§ 371 (c)(1),
(2) Date: Sep. 11, 2020

(87) PCT Pub. No.: WO2019/187118
PCT Pub. Date: Oct. 3, 2019

(65) Prior Publication Data
US 2021/0005417 A1  Jan. 7, 2021

(51) Int. Cl.
H01J 37/147 (2006.01)
H01J 37/244 (2006.01)
H01J 37/28 (2006.01)

(52) U.S. Cl.
CPC ........ H01J 37/1475 (2013.01); H01J 37/244 (2013.01); H01J 37/28 (2013.01)

(58) Field of Classification Search
CPC ...... H01J 37/1475; H01J 37/244; H01J 37/28; H01J 37/05; H01J 2237/053;
(Continued)

(56) References Cited

U.S. PATENT DOCUMENTS

2007/0075259 A1* 4/2007 Fujita .................. H01J 37/1475
250/396 ML
2018/0005797 A1* 1/2018 Kato ..................... H01J 37/222

FOREIGN PATENT DOCUMENTS

| JP | H11233062 A | 8/1999 |
| JP | 2001124713 A | 5/2001 |
| JP | 2003187730 A | 7/2003 |

OTHER PUBLICATIONS

Search Report dated Jun. 26, 2018 in International Application No. PCT/JP2018/013901.
(Continued)

Primary Examiner — Jason L McCormack
(74) Attorney, Agent, or Firm — Miles & Stockbridge, P.C.

(57) ABSTRACT

A charged particle beam application apparatus includes a beam separator. The beam separator includes a first magnetic pole, a second magnetic pole facing the first magnetic pole, a first electrode and a second electrode that extend along an optical axis of a primary beam and are arranged in a first direction perpendicular to the optical axis, on a first surface of the first magnetic pole which faces the second magnetic pole, and a third electrode and a fourth electrode that extend along the optical axis and face the first electrode and the second electrode, respectively, on a second surface of the second magnetic pole which faces the first magnetic pole.

15 Claims, 8 Drawing Sheets

(58) Field of Classification Search
CPC ......... H01J 2237/055; H01J 2237/2448; H01J 2237/2817
USPC ...... 250/306, 307, 310, 311, 396 R, 396 ML
See application file for complete search history.

(56) References Cited

OTHER PUBLICATIONS

Written Opinion dated Jun. 26, 2018 in International Application No. PCT/JP2018/013901.

* cited by examiner

CHARGED PARTICLE BEAM APPLICATION APPARATUS

TECHNICAL FIELD

The present disclosure relates to a charged particle beam application apparatus.

BACKGROUND ART

A charged particle beam application apparatus is used to observe a fine structure. In a semiconductor manufacturing process, a charged particle beam application apparatus that uses a charged particle beam such as an electron beam is used for measuring or inspecting the size and shape of a semiconductor device. One example is a scanning electron microscope (SEM). The SEM irradiates a sample to be observed with an electron beam (hereinafter referred to as a primary beam) generated from an electron source, detects secondary electrons generated thereby with a detector, and converts them into an electric signal, thereby generating an image.

In order to detect the secondary electrons, a beam separator that separates the trajectory of the secondary electrons (hereinafter referred to as a secondary beam) from the primary beam is required. As the beam separator, a magnetic field sector that deflects a beam in a wide magnetic field region and an ExB that deflects a beam by an electromagnetic field generated in a local region are known. Further, for example, PTL 1 discloses a beam separator using an electric field and a magnetic field.

CITATION LIST

Patent Literature

PTL 1: JP 2003-187730 A

SUMMARY OF INVENTION

Technical Problem

The SEM requires a detection optical system that directly detects the secondary beam and discriminates a signal of the secondary beam in order to improve the contrast of the image to be acquired. In order to arrange the detection optical system without interfering with the primary beam, a beam separator capable of deflecting the secondary beam at a large angle is desired.

However, the conventional magnetic field sector can deflect the secondary beam at a large angle (90 degrees), but it is difficult to adjust an optical axis because magnetic field sector deflects the primary beam, that is, because the primary beam is a curved optical system. Further, the conventional magnetic field sector is tall and easily interferes with other optical elements. In the ExB, the control of the primary beam is relatively simple, but the deflection angle of the secondary beam is small in principle. Therefore, it is necessary to arrange a secondary optical system for guiding the secondary beam to the detection optical system and an optical element arranged upstream of the ExB with respect to the primary beam with a distance from the ExB. This not only has a large restriction on the optical conditions, but also increases the column length of the SEM, which increases the influence of external vibrations and degrades the resolution of the primary beam.

Solution to Problem

According to one example of the present disclosure, there is provided a charged particle beam application apparatus that detects a secondary beam of charged particles generated by irradiating a sample with a primary beam of charged particles, the charged particle beam application apparatus including: a primary beam source that outputs a primary beam for radiating a sample; a beam separator that generates an internal electromagnetic field so that the primary beam travels straight, and a trajectory of the primary beam and a trajectory of the secondary beam are separated; a control unit that controls a voltage and a current applied to an electrode and a coil that generate the internal electromagnetic field of the beam separator; and a detector that detects the secondary beam from the beam separator, in which the beam separator includes: a first magnetic pole; a second magnetic pole facing the first magnetic pole; a first electrode and a second electrode that extend along an optical axis of the primary beam and are arranged in a first direction perpendicular to the optical axis, on a first surface of the first magnetic pole which faces the second magnetic pole; and a third electrode and a fourth electrode that extend along the optical axis and face the first electrode and the second electrode, respectively, on a second surface of the second magnetic pole which faces the first magnetic pole.

According to another example of the present disclosure, there is provided a charged particle beam application apparatus that detects a secondary beam of charged particles generated by irradiating a sample with a primary beam of charged particles, the charged particle beam application apparatus including: a primary beam source that outputs a primary beam for radiating a sample; a beam separator that includes a first electromagnetic pole unit and a second electromagnetic pole unit facing each other, and generates an internal electromagnetic field so that the primary beam travels straight, and a trajectory of the primary beam and a trajectory of the secondary beam are separated; and a detector that detects the secondary beam from the beam separator, in which the first electromagnetic pole unit includes a first plate made of a magnetic material, the first plate extending along an optical axis of the primary beam, in which the second electromagnetic pole unit includes a second plate facing the first plate in a second direction perpendicular to the optical axis, the second plate being made of a magnetic material and extending along the optical axis, in which a position of the optical axis in the second direction is between the first plate and the second plate in the second direction, in which the first plate includes first and second magnetic poles on a surface facing the second plate, in which the second plate includes third and fourth magnetic poles facing the first and second magnetic poles, in which the first and second magnetic poles extend along the optical axis and are arranged in a first direction perpendicular to the optical axis and the second direction, in which the third and fourth magnetic poles extend along the optical axis, are arranged in the first direction, and generate magnetic fields for the first and second magnetic poles, respectively, in which a potential applied to the second magnetic pole is higher than a potential applied to the first magnetic pole, and in which a potential applied to the fourth magnetic pole is higher than a potential applied to the third magnetic pole.

Advantageous Effects of Invention

According to one aspect of the present disclosure, it is possible to provide a charged particle beam application apparatus in which the control of the primary beam is simple and the secondary beam is deflected at a large angle to directly detect the secondary beam and discriminate a signal of the secondary beam.

DESCRIPTION OF EMBODIMENTS

Figure 1:
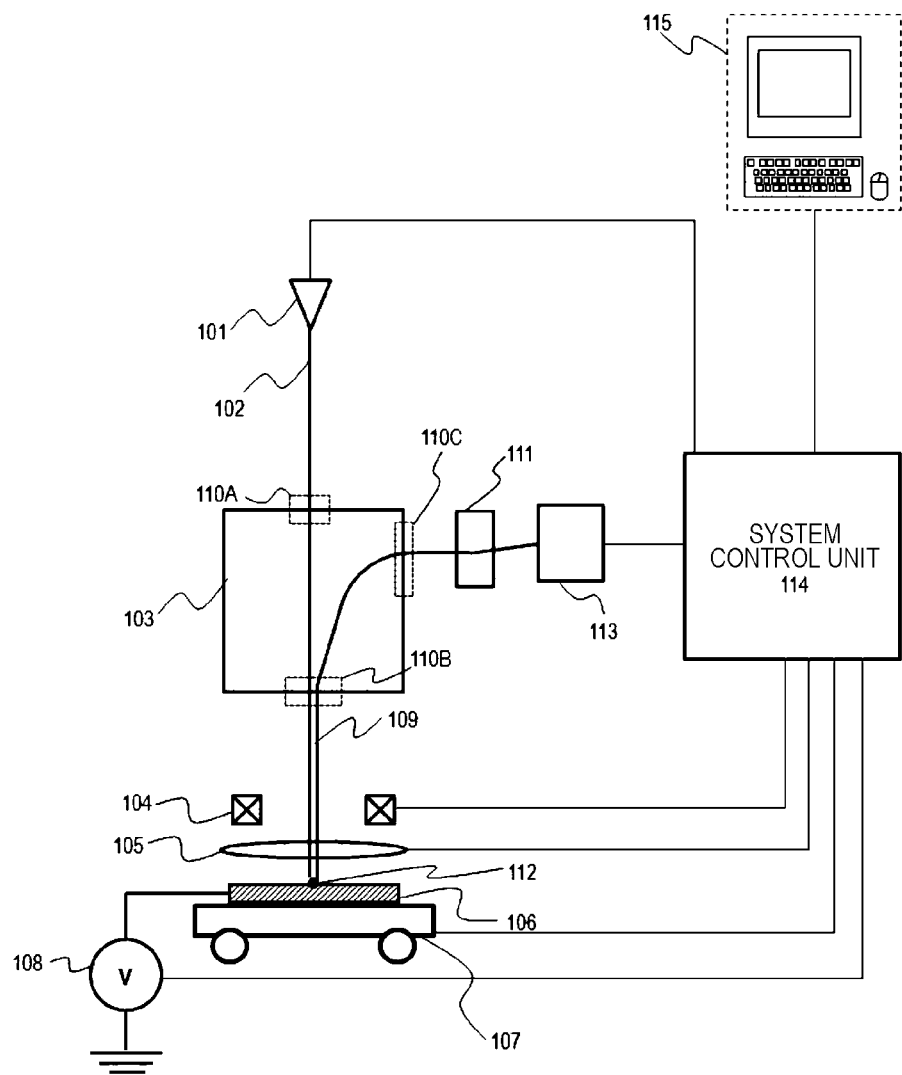
FIG. 1 is a view showing a schematic configuration of an electron beam observation apparatus according to a first embodiment.

Embodiments will be described below with reference to the drawings. In all the drawings for explaining the embodiments, the same elements are denoted by the same reference numerals, and the repeated description thereof will be omitted. In the following, as an example of a charged particle beam application apparatus, a sample observation apparatus (electron microscope) using an electron beam is shown. However, the effect of the feature of the present disclosure is not lost even in a measurement apparatus and an inspection apparatus as well as the apparatus using an ion beam.

First Embodiment

FIG. 1 is a view showing a schematic configuration of an electron beam observation apparatus according to a first embodiment, which is an example of a charged particle beam application apparatus. First, the apparatus configuration will be described. A beam separator 103, a scanning deflector 104, and an objective lens 105 are arranged on the trajectory of a primary beam 102 extracted from an electron source 101 (primary beam source) toward a sample 106.

The sample 106 is placed on a sample transfer stage 107. The primary beam 102 radiated on the sample 106 interacts with a substance near the surface of the sample 106 to generate a secondary beam 109. As optical elements that act on the secondary beam 109, a secondary optical system 111 that guides the secondary beam to the detector and a detector 113 are arranged. The secondary optical system 111 and the detector 113 are arranged outside the beam separator 103. The configurations of the secondary optical system 111 and the detector 113 depend on the presence/absence of signal discrimination of the secondary beam and the type of the signal in the case of performing discrimination, and a specific configuration example will be described later.

A diaphragm, a lens, an aligner, a stigmator, and the like may be added to adjust the current and axis of the electron beam (not shown). In the present specification, elements such as an electron source, a lens, an aligner, and a detector that act on a charged particle beam are collectively referred to as optical elements.

The scanning deflector 104, the objective lens 105, and the secondary optical system 111 in this embodiment generate a magnetic field by exciting current applied to a coil of each optical element, and act on the primary beam 102 or the secondary beam 109 (electron beam). These optical elements may generate an electric field or a combination of a magnetic field and an electric field to act on the electron beam.

All the above optical elements are controlled by a system control unit 114. For example, the system control unit 114 controls the amount of current and voltage applied to each optical element. A user can confirm and change the setting of each optical element using a user terminal 115. The user terminal 115 is a computer with an input/output device.

A method of acquiring an image of a sample using this apparatus configuration will be described. The primary beam (electron beam) 102 emitted from the electron source 101 enters the beam separator 103 from an entrance 110A of the beam separator 103. Details of the structure of the beam separator 103 and the action on the electron beam will be described later.

The primary beam 102 travels straight in the beam separator 103 and exits from an entrance 110B of the beam separator 103. The primary beam 102 emitted from the beam separator 103 passes through the scanning deflector 104 and the objective lens 105, and then is focused at a position 112 on the sample 106. The exciting current of the scanning deflector 104 is controlled by the system control unit 114 so that the primary beam 102 scans the sample 106.

Since a negative voltage is applied to the sample 106 by a retarding voltage source 108, the primary beam 102 is decelerated and then radiated on the sample 106. In this example, the retarding voltage source 108 applies a negative voltage to the sample 106, but the applied voltage is not limited and may be 0 kV. The primary beam 102 radiated on the sample 106 interacts with a substance near the surface, and reflected electrons and other secondary electrons are generated depending on the shape and material of the sample. In this embodiment, these electrons are collectively called secondary electrons.

Since a negative voltage is applied to the sample 106 by the retarding voltage source 108, the secondary electrons generated from the position 112 become the secondary beam 109 which is accelerated and returns to the trajectory of the primary beam 102. The secondary beam 109 passes through the objective lens 105 and the scanning deflector 104, and then enters the beam separator 103 from the entrance 110B of the beam separator 103.

The beam separator 103 is controlled by the system control unit 114 so that the incident secondary beam 109 is deflected by a predetermined angle.

The secondary beam 109 exits from the beam separator 103 from an entrance 110C of the beam separator 103. The secondary beam 109 emitted from the beam separator 103 enters the detector 113 via the secondary optical system 111. The detector 113 detects the secondary beam 109 and converts it into a detection signal. The value of the detection signal changes depending on the shape and material of the sample 106 at the position 112 at which the primary beam 102 is applied. The system control unit 114 converts each value of the detection signal into brightness and generates an SEM image. The user terminal 115 displays the generated SEM image.

Figure 2A:
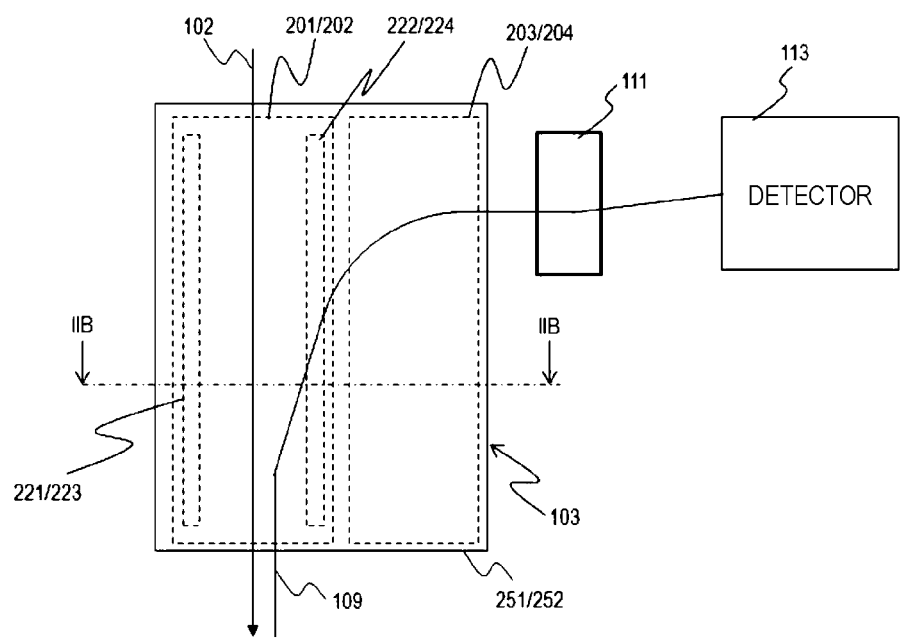
FIG. 2A shows a front view of a beam separator according to the first embodiment as seen in a direction perpendicular to an optical axis of a primary beam.
Figure 2B:
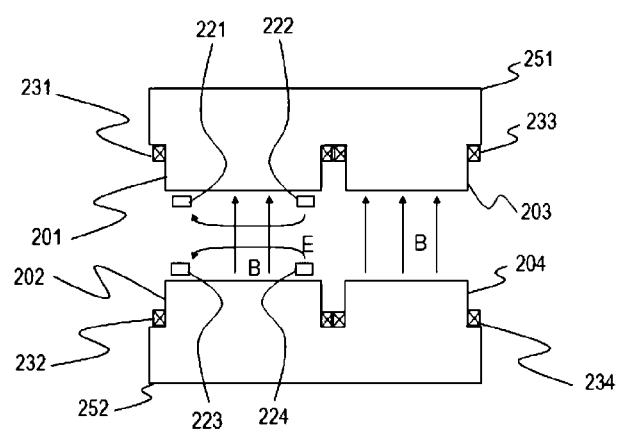
FIG. 2B shows a sectional view taken along the line IIB-IIB in FIG. 2A.

Next, a configuration example of the beam separator 103 in this embodiment will be described with reference to FIGS. 2A and 2B. FIG. 2A shows a front view of the beam separator 103 as seen from the front side of the drawing in the direction perpendicular to the optical axis (traveling direction) of the primary beam 102. In FIG. 2A, a part of the internal structure of the beam separator 103 is shown by a broken line. FIG. 2B shows a sectional view taken along the line IIB-IIB in FIG. 2A.

The beam separator 103 includes two plates 251 and 252 which face each other and are parallel to each other. The plates 251 and 252 are magnetic materials, and are made of, for example, iron, nickel, or an alloy thereof. In this example, the shapes of the plates 251 and 252 are mirror-symmetrical.

Annular grooves (for example, rectangular annular shapes) that define magnetic poles 201 to 204, respectively, are formed on the facing surfaces of the plates 251 and 252. Coils 231 to 234 are embedded in the annular grooves, respectively, and parts of the plates 251 and 252 form magnetic poles.

Specifically, as shown in FIG. 2B, the coils 231 and 233 are embedded in the surface of the plate 251 facing the plate 252. The portion of the plate 251 that is surrounded (defined) by the coil 231 constitutes the magnetic pole 201. The portion of the plate 251 that is surrounded (defined) by the coil 233 constitutes the magnetic pole 203.

As shown in FIG. 2A, the magnetic pole 201 and the magnetic pole 203 extend along the optical axis of the primary beam 102 on the surface of the plate 251, the magnetic pole 201 acts on the primary beam 102 and the secondary beam 109, and the magnetic pole 203 acts only on the secondary beam 109.

As shown in FIG. 2B, the coils 232 and 234 are embedded in the surface of the plate 252 facing the plate 251. The portion of the plate 252 that is surrounded (defined) by the coil 232 constitutes the magnetic pole 202. The portion of the plate 252 that is surrounded (defined) by the coil 234 constitutes the magnetic pole 204.

As shown in FIG. 2A, the magnetic pole 202 and the magnetic pole 204 extend along the optical axis of the primary beam 102 on the surface of the plate 252, the magnetic pole 202 acts on the primary beam 102 and the secondary beam 109, and the magnetic pole 204 acts only on the secondary beam 109.

As shown in FIG. 2B, the magnetic poles 201 and 202 face each other. The facing surfaces of the magnetic poles 201 and 202 are parallel. The shapes of the facing surfaces of the magnetic poles 201 and 202 are mirror-symmetrical.

Further, the magnetic poles 203 and 204 face each other. The facing surfaces of the magnetic poles 203 and 204 are parallel. The shapes of the facing surfaces of the magnetic poles 203 and 204 are mirror-symmetrical.

In this embodiment, the shapes of the magnetic poles 201 to 204 in the front view are rectangular shapes, but the shapes are not particularly limited, and for example, the magnetic poles 201 to 204 may have a shape other than the rectangular shape in plan view.

In the beam separator 103, magnetic fields and an electric field for causing the primary beam 102 to travel straight and deflecting the secondary beam 109 at a large angle are formed. The magnetic fields in the beam separator 103 will be described. The magnetic field is formed between the magnetic poles 201 and 202 by causing an electric current to flow through the coils 231 and 232. In the example of FIG. 2B, (the magnetic flux of) the magnetic field is directed from the magnetic pole 202 to the magnetic pole 201. Further, the magnetic field is formed between the magnetic poles 203 and 204 by causing an electric current to flow through the coils 233 and 234. In the example of FIG. 2B, (the magnetic flux of) the magnetic field is directed from the magnetic pole 204 to the magnetic pole 203. The system control unit 114 gives an exciting current to the coils 231 to 234 so as to form the magnetic fields shown in FIG. 2B. The system control unit 114 can independently control the magnetic field between the magnetic poles 202 and 201 and the magnetic field between the magnetic poles 204 and 203.

Next, the electric field in the beam separator 103 will be described. Electrodes 221 and 222 are arranged on the magnetic pole 201. An insulating layer (not shown) is present between the electrodes 221 and 222 and the magnetic pole 201 to insulate the magnetic pole 201 from the electrodes 221 and 222. As shown in FIG. 2A, the electrodes 221 and 222 have a strip-shape extending along the optical axis of the primary beam 102 on the surface of the magnetic pole 201, and are arranged in the direction perpendicular to the optical axis of the primary beam 102. In FIG. 2A, the electrodes 221 and 222 are arranged in the left-right direction.

Electrodes 223 and 224 are arranged on the magnetic pole 202. An insulating layer (not shown) is present between the electrodes 223 and 224 and the magnetic pole 202 to insulate the magnetic pole 202 from the electrodes 223 and 224. As shown in FIG. 2A, the electrodes 223 and 224 have a strip-shape extending along the optical axis of the primary beam 102 on the surface of the magnetic pole 202, and are arranged in the direction perpendicular to the optical axis of the primary beam 102. In FIG. 2A, the electrodes 223 and 224 are arranged in the left-right direction.

In this embodiment, the electrodes 221 and 223 face each other, and their shapes are mirror-symmetrical. Further, the electrodes 222 and 224 face each other, and their shapes are mirror-symmetrical.

By applying a voltage to the electrodes 221 to 224, an electric field is formed between the magnetic poles 201 and 202. In the example of FIG. 2B, (the electric flux of) the electric field is directed from the electrodes 222 and 224 to the electrodes 221 and 223. That is, the potentials of the electrodes 222 and 224 are relatively positive with respect to the potentials of the electrodes 221 and 223. As a result, orthogonal magnetic and electric fields are formed in the space between the magnetic poles 201 and 202 near the primary beam 102. By using magnetic materials for the electrodes 221 to 224, the magnetic resistance between the magnetic poles 201 and 202 can be reduced, and the exciting current required for the coils 231 and 232 can be reduced.

The system control unit 114 applies potentials to the electrodes 222 to 224 so that the electric field shown in FIG. 2B is formed. For example, the potentials applied to the electrodes 222 and 224 are the same, and the potentials applied to the electrodes 221 and 223 are the same. The potentials applied to the electrodes 222 and 224 and the electrodes 221 and 223 may be different.

As shown in FIG. 2A, the primary beam 102 passes through the space surrounded by the magnetic pole 201, the magnetic pole 202, and the electrodes 221 to 224 in the beam separator 103. The electric field and the magnetic field near the primary beam 102 formed between the magnetic pole 201 and the magnetic pole 202 are orthogonal to each other, and the directions of the deflection actions exerted on the primary beam 102 are opposite to each other. The system control unit 114 controls the currents applied to the coils 231 and 232 and the voltages applied to the electrodes 221 to 224 so that the intensities of the deflection actions become the same. That is, the Wien condition is satisfied, and the primary beam 102 travels straight in the beam separator 103. This means that the control of the primary beam is simpler than the conventional magnetic sector that also deflects the primary beam.

Specifically, the deflection action of the electric field received by the primary beam acts from left to right in FIG. 2B, and the deflection action of the magnetic field acts from right to left in FIG. 2B. The force due to the electric field acts in the direction perpendicular to the optical axis of the primary beam 102 and along the facing surfaces of the magnetic poles 201 and 202 (in-plane direction) from the magnetic poles 201/202 to the magnetic poles 203/204. The force due to the magnetic field acts in the direction perpendicular to the optical axis of the primary beam 102 and along the facing surfaces of the magnetic poles 201 and 202 from the magnetic poles 203/204 to the magnetic poles 201/202.

The secondary beam 109 that has entered the beam separator 103 enters the space surrounded by the magnetic pole 201, the magnetic pole 202, and the electrodes 221 to 224. The traveling direction of the secondary beam 109 includes a component in the opposite direction to the primary beam 102. Therefore, the secondary beam 109 receives a force in the same direction from the electric field and the magnetic field in the space surrounded by the magnetic pole 201, the magnetic pole 202, and the electrodes 221 to 224.

Specifically, the secondary beam 109 receives the deflecting action by the electric field which acts from left to right in FIG. 2B and the deflecting action by the magnetic field. The electric field and the magnetic field cause the secondary beam 109 to be deflected in the direction along the surfaces of the magnetic poles 201 and 202 toward the detector 113. In this way, the electromagnetic field formed by the magnetic pole 201, the magnetic pole 202, and the electrodes 221 to 224 separates the secondary beam 109 from the primary beam 102.

The secondary beam 109 deflected by the electromagnetic field exits from the space between the magnetic poles 201 and 202 and enters the space between the magnetic poles 203 and 204. The magnetic poles 203 and 204 generate the magnetic field in the same direction as the magnetic field generated by the magnetic poles 201 and 202. FIG. 2A shows a case where the secondary beam 109 passes through the space between the electrodes 222 and 224, and the secondary beam 109 is continuously deflected in the regions of the magnetic poles 201/202 and the magnetic poles 203/204.

However, the secondary beam 109 need not pass through the space between the electrodes 222 and 224. Further, the present invention does not lose the effect even when the secondary beam 109 is not continuously deflected by dividing the magnetic poles 203 and 204 and providing a region having no magnetic field in the beam separator 103. In order to relax restrictions on optical elements near the beam separator 103 and reduce resolution deterioration due to vibration caused by the column length of the SEM, it is important to make the beam separator 103 that deflects the secondary beam 109 at a large angle compact and shorten the length of the primary beam along the optical axis.

As the large angle deflection of the secondary beam 109 in the compact beam separator 103, a method of further deflecting the secondary beam 109 in the magnetic field between the magnetic poles 203 and 204 immediately after the secondary beam 109 passes through the space between the electrodes 222 and 224 and is separated from the primary beam 102 is effective. To that end, the integral plates 251/252 with the magnetic poles 201/203 and 203/204 are used.

The secondary beam 109 receives the deflecting action which acts from left to right in FIG. 2B in the space between the magnetic poles 203 and 204. The magnetic field causes the secondary beam 109 to be deflected at a large angle toward the detector 113 in the direction along the surfaces of the magnetic poles 203 and 204, and then the secondary beam 109 exits from the beam separator 103.

Figure 2C:
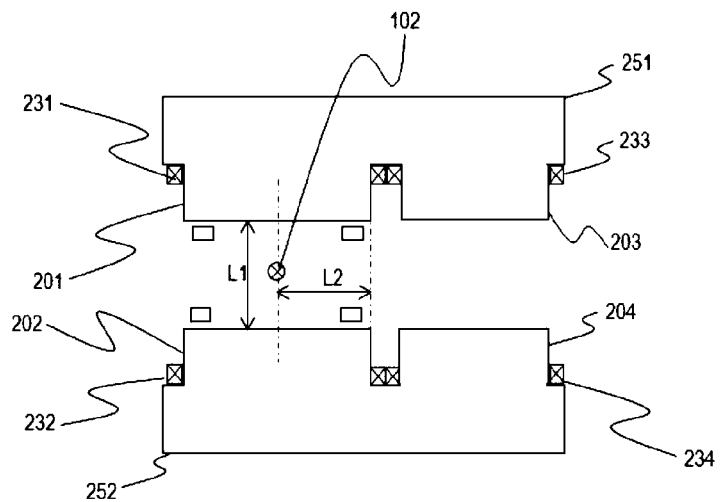
FIG. 2C shows an example of the sizes of magnetic poles in the beam separator.

FIG. 2C shows an example of the sizes of the magnetic poles in the beam separator 103. In FIG. 2C, the distance between the magnetic pole 201 and the magnetic pole 202, more specifically, the distance between the facing surfaces of the magnetic pole 201 and the magnetic pole 202 is represented by L1. Furthermore, the distance between the optical axis of the primary beam 102 and the end of the magnetic pole 201 or the magnetic pole 202 on the side of the magnetic pole 203 or the magnetic pole 204 is represented by L2.

In one example, the distance L2 is equal to or more than half the distance L1. By satisfying this relationship, the influence of the magnetic field formed between the magnetic poles 203 and 204 on the primary beam 102 can be effectively reduced.

In FIGS. 2B and 2C, the distance between the magnetic pole 201 and the magnetic pole 202 (distance between the facing surfaces) and the distance between the magnetic pole 203 and the magnetic pole 204 are the same, but even if they are different, the effect of the invention is not lost. For example, the distance between the magnetic pole 203 and the magnetic pole 204 may be greater than the distance between the magnetic pole 201 and the magnetic pole 202. Further, the magnetic field strengths of the magnetic pole 201 and the magnetic pole 202 and the magnetic field strength between the magnetic pole 203 and the magnetic pole 204 are the same or different. For example, the magnetic field between the magnetic poles 203 and 204 is stronger than the magnetic fields of the magnetic poles 201 and 202. The magnetic poles 203 and 204 may be omitted.

The secondary beam 109 emitted from the beam separator 103 passes through the secondary optical system 111 and is then detected by the detector 113. Since the beam separator 103 deflects the secondary beam at a large angle, the beam separator 103 does not interfere with the optical elements on the optical axis of the primary beam 102, and therefore the degree of freedom in arranging the secondary optical system 111 is high. When the secondary beam deflection angle of the beam separator 103 is 90 degrees, the secondary optical system 111 can be arranged near the entrance 110C of the beam separator 103.

A method of directly detecting the secondary beam and discriminating the signal in order to improve the contrast of the SEM image will be described using a specific configuration example of the secondary optical system 111 and the detector 113 shown in FIG. 2D. The secondary optical system 111 is composed of a deflector 262 and a lens 263, and the detector 113 is composed of a plurality of detectors 264A to 264C.

In this embodiment, an example in which emission angle signal discrimination of the secondary electrons is performed by detecting the secondary electrons generated from the sample 106 with different detectors according to their emission angles will be described. The secondary beam 109 emitted from the beam separator 103 has a finite spread, and its spatial distribution depends on the energy and angular distribution of the secondary electrons emitted from the sample 106. The secondary beam 109 shown in FIG. 2D is composed of secondary beams 261A to 261C emitted from the sample 106 to the left (not shown), top, and right (not shown) in FIG. 2A.

The secondary beams 261A to 261C are deflected by the deflector 262 toward the detector 113, and then the lens 263 deflects the secondary beams 261A to 261C toward the different detectors 264A to 264C. The signal discrimination of the secondary beams is performed by detecting the secondary beams 261A to 261C with the different detectors 264A to 264C, respectively. The SEM images generated by converting the detection signals of the detectors 264A to 264C, respectively, are displayed on the user terminal 115.

The user terminal 115 displays all the SEM images generated from the detection signals of the detectors 264A to 264C or the SEM image selected by the user. By performing the signal discrimination of the secondary beams, it becomes possible to improve the contrast due to the emission angles of the secondary electrons emitted from the sample 106.

The secondary optical system 111 may include an astigmatism corrector, a multistage lens, and other optical elements. Further, the optical elements may be omitted. Further, in this embodiment, the signal discrimination according to the emission angles of the secondary electrons is performed, but by including an optical element such as a Wien filter in the secondary optical system 111, the signal discrimination according to the emission energies of the secondary electrons can be performed.

Figure 2D:
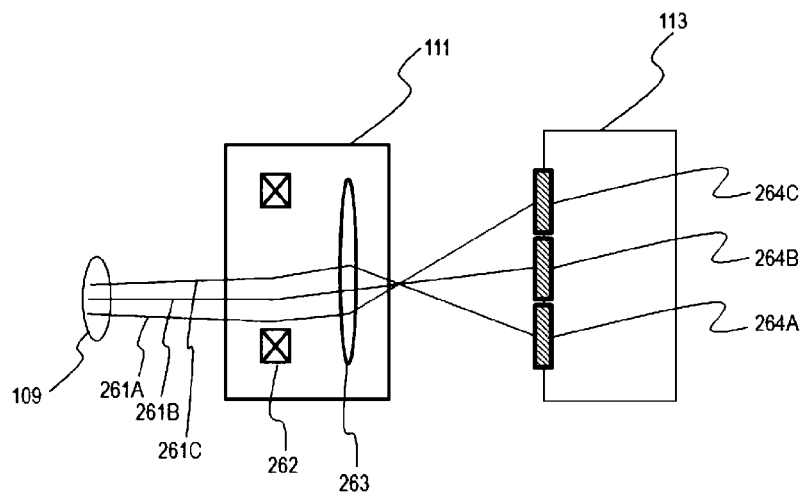
FIG. 2D shows a specific configuration example of a secondary optical system and a detector for discriminating a signal of a secondary beam.

The detector 113 shown in FIG. 2D is composed of the three detectors 264A to 264C, but the effect of the present invention is not lost even when the number of detectors is three or more or three or less. Further, the detector array may be one-dimensional or two-dimensional. It goes without saying that the more the number of detectors, the more accurate the signal discrimination of secondary electrons can be made. As described above, it is possible to realize the electron beam observation apparatus capable of directly detecting the secondary beam and discriminating the signal.

Second Embodiment

In the first embodiment, by using the pair of the magnetic poles 201 and 202 and the two pairs of the electrode 221 and the electrode 222, and the electrode 223 and the electrodes 224, the electromagnetic field region where the primary beam 102 travels straight and the secondary beam 109 is deflected is formed in the beam separator 103. In this case, the region where the electric field is uniform near the optical axis of the primary beam 102 is narrow.

When the primary beam 102 passes through the region where the electric field is non-uniform, the primary beam 102 does not travel straight in the beam separator 103, which makes it difficult to control the primary beam 102. Further, aberration is generated in the primary beam 102, which deteriorates the resolution of the SEM image. Therefore, if the region where the electric field is uniform is narrow, it is difficult to adjust the optical axis of the primary beam 102. Therefore, in this embodiment, an electron beam observation apparatus in which the uniformity of the electric field in the beam separator 103 is improved and the accuracy of adjusting the optical axis of the primary beam 102 is relaxed will be described.

Figure 3A:
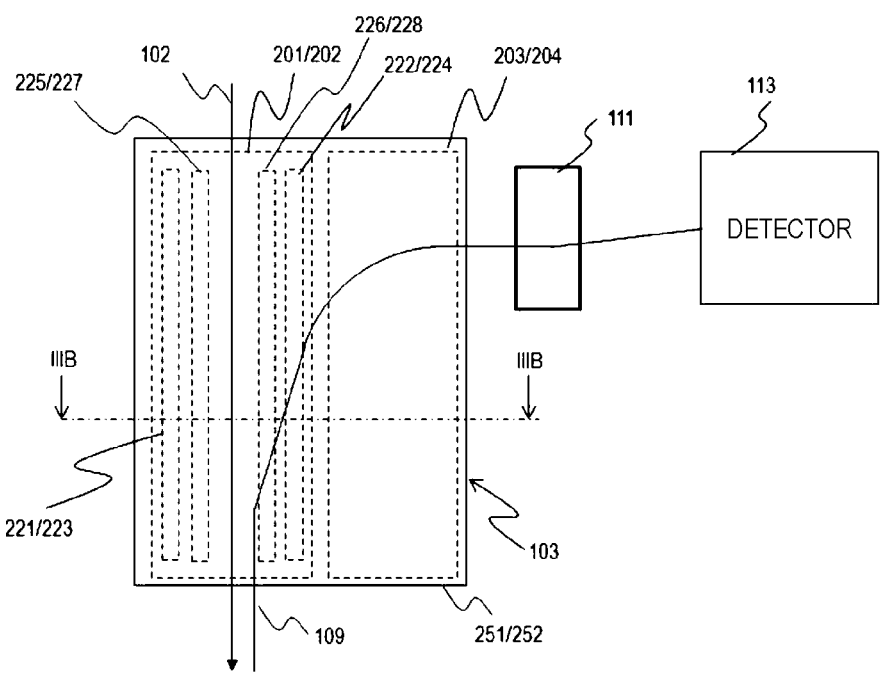
FIG. 3A shows a front view of a beam separator according to a second embodiment as seen in the direction perpendicular to the optical axis of the primary beam.
Figure 3B:
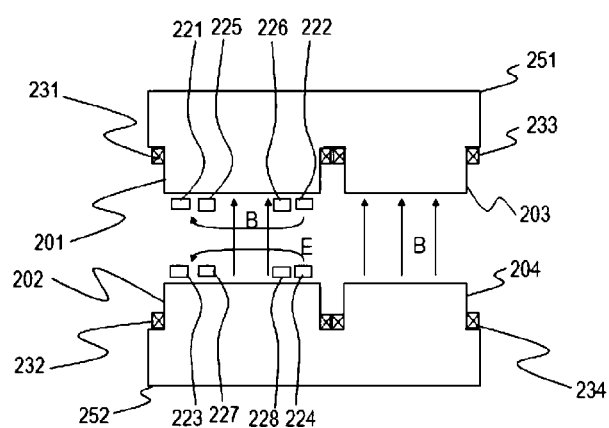
FIG. 3B shows a sectional view taken along the line IIIB-IIIB in FIG. 3A.

A second embodiment will be described with reference to FIGS. 3A to 5B. FIGS. 3A and 3B show another configuration example of the beam separator 103. The apparatus configuration is the same as the apparatus configuration of the first embodiment except for the beam separator 103, and thus the description is omitted. FIG. 3A shows a front view of the beam separator 103 as seen from the front side of the drawing in the direction perpendicular to the optical axis of the primary beam 102. FIG. 3B shows a sectional view taken along the line IIIB-IIIB in FIG. 3A. The beam separator 103 of this embodiment includes electrodes 225 to 228 in addition to the configuration of the first embodiment. The electrodes 225 to 228 can generate a more uniform electric field.

The electrodes 225 and 226 are arranged on the magnetic pole 201. An insulating layer (not shown) is present between the electrodes 225 and 226 and the magnetic pole 201 to insulate the magnetic pole 201 from the electrodes 225 and 226. As shown in FIG. 3A, the electrodes 225 and 226 extend along the optical axis of the primary beam 102 on the surface of the magnetic pole 201, and are arranged in the direction perpendicular to the optical axis of the primary beam 102. In FIG. 3A, the electrodes 225 and 226 are arranged between the electrodes 221 and 222. The electrodes 221, 225, 226, and 222 are arranged in this order in the left-right direction or in the direction from the optical axis of the primary beam 102 toward the detector 113.

The electrodes 227 and 228 are arranged on the magnetic pole 202. An insulating layer (not shown) is present between the electrodes 227 and 228 and the magnetic pole 202 to insulate the magnetic pole 202 from the electrodes 227 and 228. As shown in FIG. 3A, the electrodes 227 and 228 extend along the optical axis of the primary beam 102 on the surface of the magnetic pole 202, and are arranged in the direction perpendicular to the optical axis of the primary beam 102. In FIG. 3A, the electrodes 227 and 228 are arranged between the electrodes 223 and 224. In FIG. 3A, the electrodes 223, 227, 228, and 224 are arranged in this order in the left-right direction or in the direction from the optical axis of the primary beam 102 toward the detector 113.

In this embodiment, the electrodes 225 and 227 face each other, and their shapes are mirror-symmetrical. The electrodes 226 and 228 face each other, and their shapes are mirror-symmetrical. In this embodiment, the electrodes 221 to 228 have the same shape. The shapes of the electrodes 221 to 228 may be different, and the positions of the electrodes 225 and 227 and the electrodes 226 and 228 in the left-right direction in FIG. 2B may be different.

An electric field is formed by the electrodes 221 to 228. In the example of FIG. 3B, the electric field is directed from the electrodes 222 and 224 in the direction toward the electrodes 221 and 223. The potential applied to the electrode 226 is smaller than the potential applied to the electrode 222, the potential applied to the electrode 225 is smaller than the potential applied to the electrode 226, and the potential applied to the electrode 221 is smaller than the potential applied to the electrode 225.

The potential applied to the electrode 228 is smaller than the potential applied to the electrode 224, the potential applied to the electrode 227 is smaller than the potential applied to the electrode 228, and the potential applied to the electrode 223 is smaller than the potential applied to the electrode 227.

In this embodiment, the potentials applied to the electrodes 221 and 223 are the same, the potentials applied to the electrodes 225 and 227 are the same, the potentials applied to the electrodes 226 and 228 are the same, and the potentials applied to electrodes 222 and 224 are the same. The potentials applied to the electrodes of each of these electrode pairs may be different.

Also in this configuration example, in the region where the primary beam 102 passes, the electric field formed by the electrodes 221 to 228 and the magnetic field formed by the magnetic poles 201 and 202 are orthogonal to each other, and further, the Wien condition is satisfied. By increasing the number of electrodes arranged on the magnetic poles and adjusting the voltage applied to each electrode, the Wien condition for the primary beam 102 can be satisfied and at the same time, the uniformity of the electric field formed in the beam separator 103 can be improved.

In this embodiment, a uniform electric field in which the four pairs of electrodes composed of the electrodes 221, 225, 226, and 222 and the electrodes 223, 227, 228, and 224 facing them are orthogonal to the magnetic field between magnetic poles 201 and 202 is formed. By further increasing the number of electrode pairs and adjusting the voltage of each electrode to expand the region where the electric field is uniform, the accuracy of adjusting the optical axis of the primary beam 102 can be further relaxed.

Figure 4:
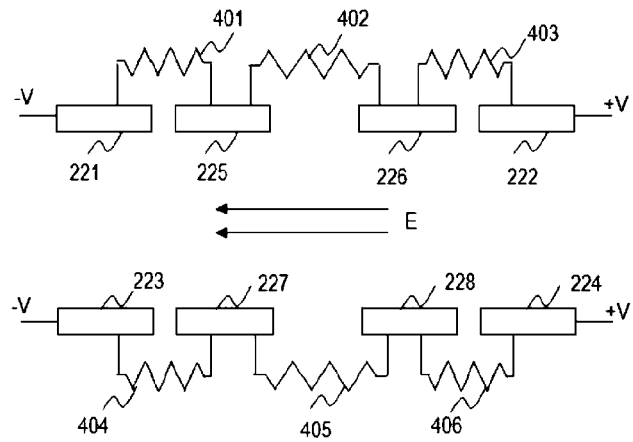
FIG. 4 shows a configuration example of electrodes connected by resistors in a beam separator according to the second embodiment.

A predetermined voltage is applied to each of the electrodes 221 to 228 by a power supply circuit of the system control unit 114. Therefore, the same number of voltage power supplies as the number of electrodes are required. Unlike this, there may be adopted a configuration in which the electrodes arranged on the same magnetic pole may be connected by resistors, and a voltage may be applied only to the electrodes at both ends. FIG. 4 shows a configuration example of the electrodes 221 to 228 connected by resistors. Adjacent electrodes of the electrodes 221, 225, 226, and 222 are connected by resistors 401 to 403. Adjacent electrodes of the electrodes 223, 227, 228, and 224 are connected by resistors 404 to 406.

The system control unit 114 applies predetermined voltages from the power supply circuit to the electrodes 221 and 222, and further applies predetermined voltages from the power supply circuit to the electrodes 223 and 224. The voltages of the electrodes 221, 225, 226, and 222 are determined by the resistance values of the electrodes 221 and 222 and the resistors 401 to 403. Similarly, the voltages of the electrodes 223, 227, 228, and 224 are determined by the resistance values of the electrodes 223 and 224 and the resistors 404 to 406. By adjusting the resistance values of the resistors 401 to 406, the voltages of the electrodes 225 to 228 are adjusted to form a uniform electric field between the magnetic poles 201 and 202.

For example, the resistance values of the resistors 401, 402, and 403 are the same as the resistance values of the resistors 404, 405, and 406, respectively. The system control unit 114 applies the same potential to the electrodes 221 and 223, and applies the same potential to the electrodes 222 and 224. From the above, by using the resistors 401 to 406, it is possible to generate a uniform electric field with a number of voltage power supplies smaller than the number of electrodes.

Figure 5A:
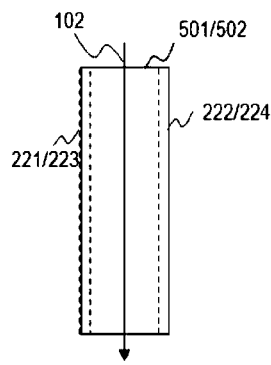
FIG. 5A shows another configuration example of forming an electric field in the beam separator according to the second embodiment.
Figure 5B:
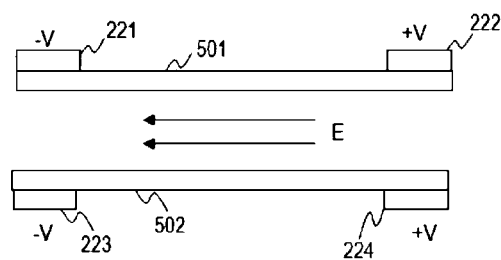
FIG. 5B shows a top view of the configuration example shown in FIG. 5A.

FIGS. 5A and 5B show another configuration example for generating an electric field. The beam separator 103 includes, in addition to the configuration of the first embodiment described with reference to FIGS. 2A and 2B, a body portion 501 formed of a sheet-shaped semiconductive material having a high resistance value that connects the electrodes 221 and 222, for example, a semiconductor such as silicon or a semiconductive insulator, and a body portion 502 formed of a sheet-shaped semiconductive material that connects the electrodes 223 and 224.

When voltages are applied to the electrodes 221 to 224, currents flow in the body portions 501 and 502. When there is a voltage difference of 1,000V or more between the electrodes 221 and 222 or between the electrodes 223 and 224, in order to reduce the loads of the power supplies in the system control unit 114, it is desirable to use the body portions 501 and 502 having a resistance value of 1 Mohm or more to reduce the current flowing therethrough.

FIG. 5A shows a plan view of structure arranged on the magnetic poles 201 and 202 as seen from the optical axis of the primary beam 102 in the direction perpendicular to the optical axis. FIG. 5B shows a top view of the structure arranged on the magnetic poles 201 and 202 as seen in the direction along the optical axis.

The body portions 501 and 502 have a sheet shape and spread along the surfaces of the magnetic poles 201 and 202 in the directions perpendicular to and parallel to the optical axis of the primary beam 102. In the example shown in FIGS. 5A and 5B, the lengths of the body portions 501 and 502 in the direction parallel to the optical axis are the same as those of the electrodes 221 to 224. The electrodes 221 and 222 are in contact with both ends of the body portion 501 between the body portion 501 and the magnetic pole 201. The electrodes 223 and 224 are in contact with both ends of the body portion 502 between the body portion 502 and the magnetic pole 202.

The system control unit 114 applies a predetermined potential to each of the electrodes 221 to 224, as in the first embodiment. The potential of the body portion 501 continuously changes between the electrodes 221 and 222. Specifically, the potential decreases from the potential applied to the electrode 222 to the potential applied to the electrode 221 from the electrode 222 toward the electrode 221. Similarly, the potential of the body portion 502 decreases from the potential applied to the electrode 224 to the potential applied to the electrode 223 from the electrode 224 toward the electrode 223.

In this way, the potentials of the body portions 501 and 502 continuously change, so that a more uniform electric field can be generated. In the above example, the electrodes are arranged between the body portion and the surface of the magnetic pole, but the body portion may be arranged between the electrodes and the surface of the magnetic pole. The electrode configuration using the resistors or the body portions shown in FIGS. 4, 5A and 5B for improving the uniformity of the electric field is not limited to the beam separator. The electrode configuration shown above can be used in a deflector that deflects a charged particle beam by an electric field.

For example, in the case of the electrode configuration of the deflector using the body portions 501 and 502, in the space between the body portions 501 and 502, an electric field is generated according to the voltage difference between the electrodes 221/223 and 222/224 in a direction perpendicular to the optical axis of the primary beam 102 and a direction parallel to the body portions 501/502. In addition, an electric field is generated according to the voltage difference between the electrodes 221/222 and 223/224 in the direction perpendicular to the optical axis of the primary beam 102 and a direction perpendicular to the body portions 501/502. Therefore, the primary beam 102 can be deflected by adjusting the voltages of the electrodes 221 to 224.

As described above, it is possible to realize the electron beam observation apparatus in which the uniformity of the electric field in the beam separator 103 is improved and the accuracy of adjusting the optical axis of the primary beam 102 is relaxed.

Third Embodiment

In the first embodiment, by using the magnetic poles 201 and 202 and the electrodes 221 to 224, the electromagnetic field region where the primary beam 102 travels straight and the secondary beam 109 is deflected is formed in the beam separator 103. In this case, it is necessary to accurately arrange the electrodes 221 to 224 on the magnetic pole 201 and the magnetic pole 202. Therefore, in this embodiment, an electron beam observing apparatus will be described in which a predetermined voltage is applied to each magnetic pole so that the magnetic poles also function as electrodes, thereby eliminating the need for arranging electrodes on the magnetic poles.

Figure 6A:
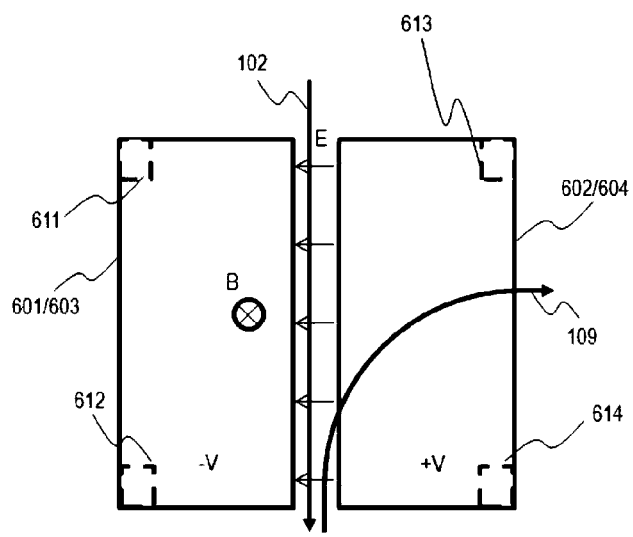
FIG. 6A shows a front view of a beam separator according to a third embodiment as seen in the direction perpendicular to the optical axis of the primary beam.
Figure 6B:
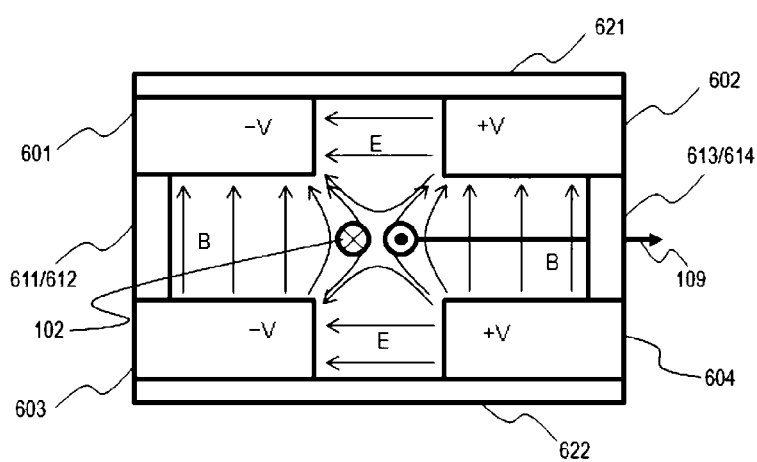
FIG. 6B is a top view of the beam separator according to the third embodiment as seen along the optical axis.

Another configuration example of the beam separator 103 will be described with reference to FIGS. 6A and 6B. The apparatus configuration is the same as the apparatus configuration of the first embodiment except for the beam separator 103, and thus the description is omitted. FIG. 6A shows a front view of the beam separator 103 as seen from the front side of the drawing in the direction perpendicular to the optical axis of the primary beam 102. FIG. 6B shows a top view of the beam separator 103 as seen along the optical axis. The beam separator 103 includes parallel plates 601 and 603 facing each other and parallel plates 602 and 604 facing each other, in a direction perpendicular to the optical axis of the primary beam 102. The plates 601 to 604 are magnetic materials.

The plates 601 and 602 are arranged so as to be perpendicular to the optical axis of the primary beam 102 and are spaced apart in a direction perpendicular to the direction in which the plates 601 and 603 or the plates 602 and 604 face each other. The plates 603 and 604 are arranged apart from each other in the same direction as the arrangement direction of the plates 601 and 602.

Coils (not shown) are embedded in the facing surfaces of the plates 601 and 603, and a part of each of the plates 601 and 603 constitutes a magnetic pole. Similarly, coils (not shown) are embedded in the facing surfaces of the plates 602 and 604, and a part of each of the plates 602 and 604 constitutes a magnetic pole. For example, a rectangular annular coil is embedded along the outer periphery of the plate. The plates 601 and 602 are fixed by a plate 621 made of an insulator. Similarly, the plates 603 and 604 are fixed by a plate 622 made of an insulator.

The plates 601 and 603 are connected by pillars 611 and 612 which act as return paths for the magnetic field. The pillars 611 and 612 are coupled to the upper and lower corners of the plates 601 and 603 on the outer sides, and are spaced apart from each other in the direction along the optical axis. Similarly, the plates 602 and 604 are connected by pillars 613 and 614. The pillars 613 and 614 are coupled to the upper and lower corners of the plates 602 and 604 on the outer sides, and are spaced apart from each other in the direction along the optical axis.

As shown in FIG. 6B, the beam separator 103 forms therein a magnetic field directed from the plate 603 to the plate 601 and a magnetic field directed from the plate 604 to the plate 602. Even in the space surrounded by the four plates 601 to 604, a magnetic field including a magnetic field directed from the plate 603 to the plate 601 and a magnetic field directed from the plate 604 to the plate 602 is formed.

The magnetic field directed from the plate 604 to the plate 602 returns to the plate 604 through the pillars 613 and 614. Similarly, the magnetic field directed from the plate 603 to the plate 601 returns to the plate 603 through the pillars 611 and 612. Note that, also in a beam separator 103 of another embodiment, the facing plates may be connected by pillars.

The system control unit 114 applies a predetermined potential to each of the plates 601 to 604 and causes them to function as electrodes. In the example shown in FIGS. 6A and 6B, the same potential is applied to the plates 601 and 603, and the same potential is applied to the plates 602 and 604. The potentials to the plates 601 and 603 are lower than the potentials to the plates 602 and 604. Therefore, in the beam separator 103, electric fields directed from the plates 602 and 604 to the plates 601 and 603 are formed.

As shown in FIG. 6B, the electric fields and the magnetic fields orthogonal to each other are formed in the space surrounded by the four plates 601 to 604. The system control unit 114 applies voltages to the plates 601 to 604 so that the Wien condition is satisfied in the region where the primary beam 102 passes in the beam separator 103, and causes currents to flow through the coils embedded in the plates 601 to 604. Therefore, the primary beam 102 can travel straight in the beam separator 103.

The secondary beam 109 enters the space surrounded by the four plates 601 to 604 and is deflected by receiving the force from the magnetic fields and the electric fields. Specifically, the secondary beam 109 is deflected in the direction from left to right in FIGS. 6A and 6B and enters the space interposed between the plates 602 and 604. The secondary beam 109 receives the force due to the magnetic fields in the space and is further deflected largely in the same direction. The secondary beam 109 travels to the outside from the space interposed between the plates 602 and 604 toward the detector 113. The beam separator 103 in this embodiment does not include magnetic poles acting only on the secondary beam 109, but the magnetic poles may be provided in the same manner as in the first embodiment. Further, the electron beam may be controlled by eight magnetic poles as in the case of providing the eight electrodes in FIG. 3B.

As described above, it is possible to realize the electron beam observing apparatus that separates the secondary beam 109 from the primary beam 102 at a large angle by using the beam separator 103 that does not require the arrangement of electrodes on the magnetic poles.

Fourth Embodiment

In the first embodiment, the region where the primary beam 102 is scanned on the sample 106 by the scanning deflector 104 corresponds to the field of view of the SEM image. On the other hand, in order to move the observation field of view, it is effective to deflect the primary beam with a deflector using an electric field or a magnetic field to move the irradiation position on the sample (hereinafter referred to as image shift).

However, as a result, the trajectory of the secondary beam 109 changes, and the incident condition on the beam separator 103 also changes. In the beam separator 103 that deflects the secondary beam 109 at a large angle, since the flight distance in the beam separator is long, the secondary beam collides with the magnetic poles and the electrodes in the beam separator 103 when the incident condition changes. Therefore, in this embodiment, an electron beam observation apparatus will be described in which the trajectory of the secondary beam 109 is corrected in association with image shift so as not to collide with the magnetic poles and the electrodes.

Figure 7:
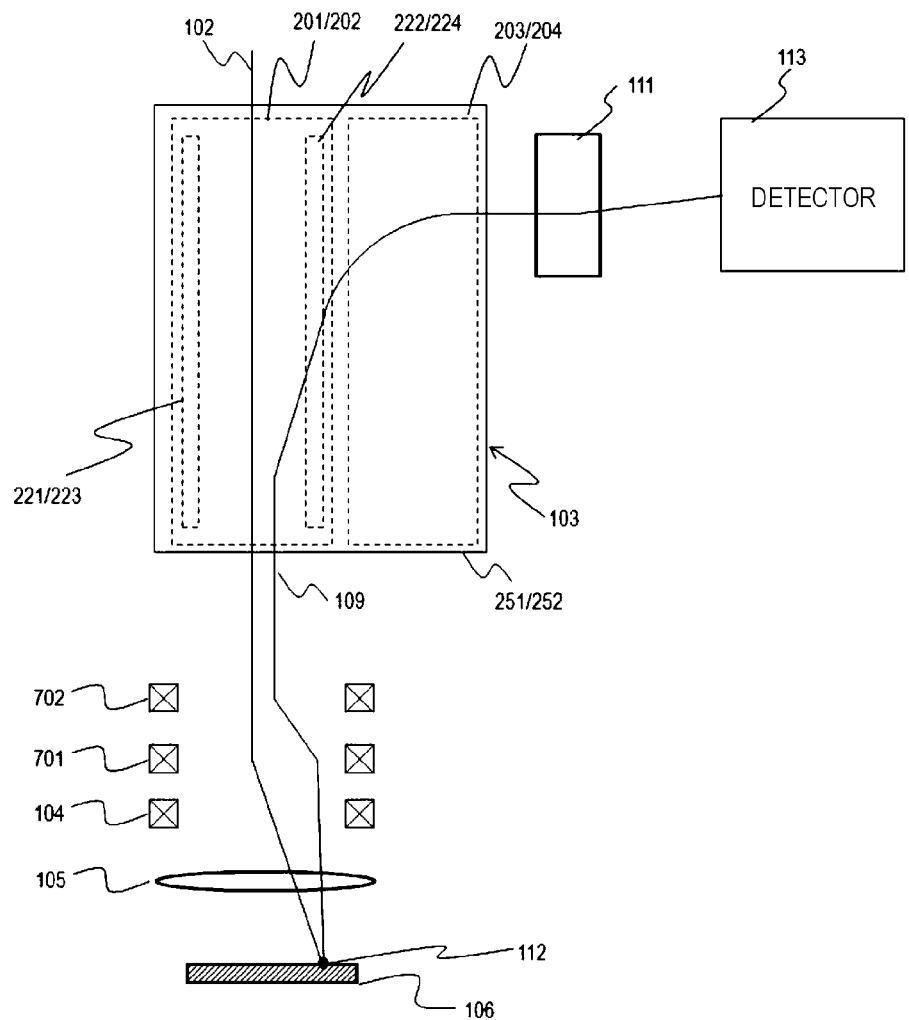
FIG. 7 shows a part of a configuration example of an electron beam observation apparatus according to a fourth embodiment.

A fourth embodiment will be described with reference to FIG. 7. FIG. 7 shows a part of a configuration example of the electron beam observation apparatus. The electron beam observation apparatus of this embodiment further includes an image shift deflector 701 and a secondary beam swing-back deflector 702 in addition to the configuration described with reference to FIGS. 2A and 2B.

The image shift deflector 701 is arranged between the beam separator 103 and the scanning deflector 104. The image shift deflector 701 deflects the primary beam 102 to change an irradiation position 112 of the primary beam 102 on the sample 106. As a result, the observation region of the sample 106 can be changed without moving the sample transfer stage 107.

The secondary beam swing-back deflector 702 is arranged between the image shift deflector 701 and the beam separator 103. The secondary beam swing-back deflector 702 is arranged upstream of the beam separator 103 as seen from the secondary beam 109, and swings back the secondary beam 109 to the beam separator 103 in association with image shift. Accordingly, the secondary beam 109 can be appropriately detected by the detector 113 regardless of the image shift amount. The arrangement relationship between the image shift 701 and the secondary beam swing-back deflector 702 may be reversed.

The operation of the charged particle beam application apparatus will be described below. Differences from the first embodiment will be mainly described. The primary beam 102 exits from the beam separator 103 and passes through the secondary beam swing-back deflector 702 and the image shift deflector 701. The exciting current of the image shift deflector 701 is controlled by the system control unit 114 so that the primary beam 102 is deflected at a predetermined angle.

The primary beam 102 is focused on the sample 106 after passing through the scanning deflector 104 and the objective lens 105. The exciting current of the scanning deflector 104 is controlled by the system control unit 114 so as to move the primary beam 102 on the sample 106 for scanning. Further, since a negative voltage is applied to the sample 106 by the retarding voltage source 108, the primary beam 102 is decelerated and then radiated on the sample 106.

Secondary electrons generated from the irradiation position of the primary beam 102 on the sample 106 are accelerated by the negative voltage from the retarding voltage source 108 to form the secondary beam 109. The secondary beam 109 passes through the objective lens 105, the scanning deflector 104, and the image shift deflector 701. The secondary beam 109 is deflected as it passes through the secondary beam swing-back deflector 702. The secondary beam 109 enters the beam separator 103 from the entrance 110B, exits from the entrance 110C, passes through the secondary optical system 111, and is detected by the detector 113.

The secondary beam swing-back deflector 702 is controlled by the system control unit 114 so that the incident position of the secondary beam 109 on the beam separator 103 approaches the incident position when the image shift deflector 701 is off, for example. For example, the secondary beam swing-back deflector 702 deflects the secondary beam 109 so that the two incident positions match.

In this way, the secondary beam swing-back deflector 702 deflects the secondary beam 109 so as to approach the condition of incidence on the beam separator 103 when the image shift deflector 701 is off. The amount of deflection (amount of swinging back) by the secondary beam swing-back deflector 702 is a vector amount, and depends on the amount of deflection (image shift amount) by the image shift deflector 701.

The secondary beam swing-back deflector 702 may deflect, when the image shift deflector 701 is on, the secondary beam 109 so that a value of an incident condition other than the incident position on the beam separator 103 approaches a value of the incident condition when the image shift deflector 701 is off. For example, the secondary beam swing-back deflector 702 may deflect, when the image shift deflector 701 is on, the secondary beam 109 so that the incident angle on the beam separator 103 matches the case that the image shift deflector 701 is on.

By controlling the secondary beam swing-back deflector 702 so that the difference in the incident condition of the secondary beam to the beam separator 103 is small between that when the image shift deflector 701 is on and that when the image shift deflector 701 is off, the adverse effect on the detection of the secondary beam due to the image shift can be reduced.

The detector 113 detects the secondary beam 109. Therefore, in the electron beam observation apparatus, the system control unit 114 controls the amount of deflection by the secondary beam swing-back deflector 702 in accordance with the amount of deflection by the image shift deflector 701, so that the secondary electron signal can be properly detected by the detector 113 at any image shift amount.

As described above, it is possible to realize the electron beam observation apparatus that corrects the trajectory of the secondary beam 109 in association with image shift so as not to collide with the magnetic poles of the beam separator 103.

Fifth Embodiment

Figure 8:
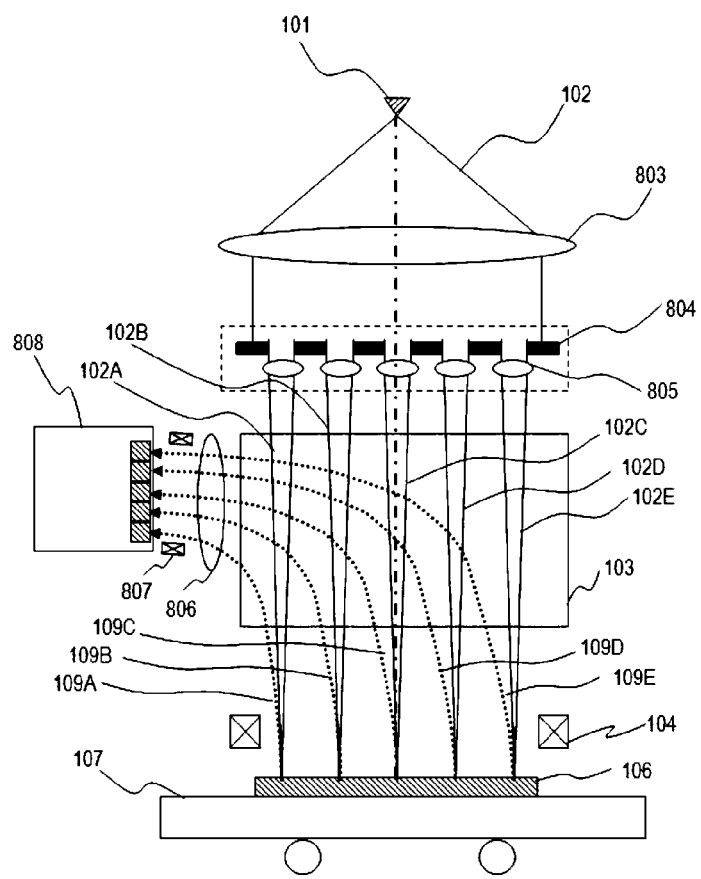
FIG. 8 shows a configuration example of a multi-beam electron beam observation apparatus according to a fifth embodiment.

In the first to fourth embodiments, only one primary beam is applied to the sample 106, and it takes time to perform observation in a wide field of view. In this case, when the sample 106 is observed simultaneously with a plurality of primary beams, the observation time can be shortened by the number of primary beams. Therefore, in this embodiment, a multi-beam electron beam observation apparatus that irradiates a sample with two or more primary beams will be described. A fifth embodiment will be described with reference to FIG. 8. FIG. 8 shows a configuration example of the electron beam observation apparatus. The beam separator 103 of the present disclosure can also be applied to a multi-beam electron beam observation apparatus. In FIG. 8, some of the components, such as the objective lens, are omitted for ease of explanation.

An example of the multi-beam electron beam observation apparatus will be described. A condenser lens 803, an aperture array 804, and a lens array 805 are arranged between the electron source 101 and the beam separator 103. The condenser lens 803 collimates the primary beam from the electron source 101 so as to be substantially parallel. The aperture array 804 is a substrate having apertures arranged in one dimension or two dimensions, and divides the primary beam from the condenser lens 803 into a plurality of primary beams. The aperture array 804 and the lens array 805 are dividers that divide the primary beam.

In the example of FIG. 8, the aperture array 804 has five apertures, and the primary beam from the electron source 101 is divided into five primary beams 102A to 102E. Although the example in which the number of primary beams is five has been described in this embodiment, the effect of the present invention is not lost even if the number of primary beams is more or less than this. Further, in this embodiment, the method of generating the primary beams 102A to 102E by dividing the primary beam 102 generated by the single electron source 101 has been described. However, even when the primary beams 102A to 102E are generated by using a plurality of electron sources, the present invention does not lose its effect.

The divided primary beams 102A to 102E are individually focused by the lens array 805. The primary beams 102A to 102E individually focused by the lens array 805 pass through the beam separator 103. In this embodiment, the electromagnetic field in the beam separator 103 is set so that the primary beams 102A to 102E travel straight.

After being emitted from the beam separator 103, the primary beams 101A to 101E are deflected by the scanning deflector 104 controlled by the system control unit 114, and scan the sample 106.

Secondary electrons generated from irradiation positions of the primary beams 102A to 102E on the sample 106 form secondary beams 109A to 109E.

The beam separator 103 deflects the secondary beams 109A to 109E and separates their trajectories from the trajectories of the primary beams 102A to 102E. The configuration of the beam separator 103 and the actions on the primary beams 102A to 102E and the secondary beams 109A to 109E are as described in the other embodiments. An electrostatic lens 806 focuses the secondary beams 109A to 109E, respectively, so that the secondary beams 109A to 109E reach the detector 808 without being mixed with each other and are detected independently.

A swing-back deflector 807 deflects the secondary beams 109A to 109E from the electrostatic lens 806. The positions at which the secondary beams are generated on the sample 106 change in synchronization with scanning, and the deflecting action of the scanning deflector 104 is received at the positions. The system control unit 114 controls the swing-back deflector 807 in synchronization with the scanning deflector 104 so that each secondary beam generated by each primary beam reaches a certain position on the detector 808 regardless of the scanning of the primary beam.

From the above, it is possible to realize the multi-beam electron beam observation apparatus that shortens the observation time in a wide field of view.

The beam separator of the present disclosure can be applied to an electron beam observation apparatus of a type different from the SEM. For example, the beam separator can be applied to low energy electron microscopy (LEEM).

The present invention is not limited to the embodiments described above, but includes various modifications. For example, the embodiments described above have been described in detail for easy understanding of the present invention, and are not necessarily limited to those having all the configurations described. Further, a part of the configuration of one embodiment can be replaced with the configuration of another embodiment, and further, the configuration of one embodiment can be added to the configuration of another embodiment. In addition, it is possible to add, delete, and replace other configurations for a part of the configuration of each embodiment.

Each of the above-described configurations, functions, processing units, and the like may be realized by hardware by designing a part or all of them with, for example, an integrated circuit. Further, each of the above-described configurations, functions, and the like may be realized by software by interpreting and executing a program that realizes each function by a processor. Information such as a program, table, and file that realizes each function can be stored in a recording device such as a memory, hard disk, or SSD (Solid State Drive), or a recording medium such as an IC card or SD card. Further, only the control lines or information lines that are considered necessary for explanation are given, and all the control lines or information lines are not necessarily given for the product. Actually, it may be considered that almost all the components are connected to each other.

The invention claimed is:

1. A charged particle beam application apparatus that detects a secondary beam of charged particles generated by irradiating a sample with a primary beam of charged particles, the charged particle beam application apparatus comprising:
a primary beam source that outputs a primary beam for radiating a sample;
a beam separator that generates an internal electromagnetic field so that the primary beam travels straight, and a trajectory of the primary beam and a trajectory of the secondary beam are separated;
a control unit that controls a voltage and a current applied to an electrode and a coil that generate the internal electromagnetic field of the beam separator; and
a detector that detects the secondary beam from the beam separator,
wherein the beam separator includes:
a first magnetic pole;
a second magnetic pole facing the first magnetic pole;
a first electrode and a second electrode that extend along an optical axis of the primary beam and are arranged in a first direction perpendicular to the optical axis, on a first surface of the first magnetic pole which faces the second magnetic pole; and
a third electrode and a fourth electrode that extend along the optical axis and face the first electrode and the second electrode, respectively, on a second surface of the second magnetic pole which faces the first magnetic pole.

2. The charged particle beam application apparatus according to claim 1,
wherein a potential applied to the second electrode is higher than a potential applied to the first electrode, and
wherein a potential applied to the fourth electrode is higher than a potential applied to the third electrode.

3. The charged particle beam application apparatus according to claim 1,
wherein the beam separator further includes:
a third magnetic pole arranged along the trajectory of the secondary beam between the first magnetic pole and the detector; and
a fourth magnetic pole facing the third magnetic pole, and
wherein the third magnetic pole and the fourth magnetic pole form an internal magnetic field that deflects the secondary beam emitted from a space between the first magnetic pole and the second magnetic pole in the same direction as a magnetic field of the internal electromagnetic field.

4. The charged particle beam application apparatus according to claim 3, wherein a distance along the first direction from an end of the first magnetic pole on a side of the third magnetic pole to the optical axis is equal to or more than half a distance between the first surface of the first magnetic pole and the second surface of the second magnetic pole.

5. The charged particle beam application apparatus according to claim 1, further comprising:
a fifth electrode and a sixth electrode that extend along the optical axis and are arranged in the first direction between the first electrode and the second electrode, on the first surface; and
a seventh electrode and an eighth electrode that extend along the optical axis and face the fifth electrode and the sixth electrode, respectively, on the second surface.

6. The charged particle beam application apparatus according to claim 5,
wherein a potential applied to the sixth electrode is higher than a potential applied to the fifth electrode and lower than a potential applied to the second electrode,
wherein the potential applied to the fifth electrode is higher than a potential applied to the first electrode,
wherein a potential applied to the eighth electrode is higher than a potential applied to the seventh electrode and lower than a potential applied to the fourth electrode, and
wherein the potential applied to the seventh electrode is higher than a potential applied to the third electrode.

7. The charged particle beam application apparatus according to claim 1, further comprising:
a first electrode group which includes a plurality of electrodes including the first electrode and the second electrode that are arranged on the first surface in the first direction and extend along the optical axis, and in which adjacent electrodes are connected by a resistor; and
a second electrode group which includes a plurality of electrodes including the third electrode and the fourth electrode that are arranged on the second surface in the first direction and respectively face the electrodes of the first electrode group, and in which adjacent electrodes are connected by a resistor,
wherein a voltage is applied to electrodes at both ends of each of the first electrode group and the second electrode group.

8. The charged particle beam application apparatus according to claim 1, further comprising:
a sheet-shaped first body portion that connects between the first electrode and the second electrode and is formed of a material having a higher resistance value than the first electrode and the second electrode; and
a sheet-shaped second body portion that connects between the third electrode and the fourth electrode and is formed of a material having higher resistance value than the third electrode and the fourth electrode,
wherein a voltage is applied between the first electrode and the second electrode and a voltage is applied between the third electrode and the fourth electrode.

9. The charged particle beam application apparatus according to claim 1, further comprising:
an image shift deflector arranged between the sample and the beam separator; and a swing-back deflector that is arranged between the image shift deflector and the beam separator, and swings back the secondary beam to the beam separator in association with image shift by the image shift deflector.

10. The charged particle beam application apparatus according to claim 1, further comprising a secondary optical system between the beam separator and the detector,
wherein the detector includes a plurality of sensors and is capable of simultaneously detecting a plurality of secondary beams from the sample.

11. The charged particle beam application apparatus according to claim 10, further comprising a divider that is arranged between the primary beam source and the beam separator, and divides the primary beam from the primary beam source into a plurality of primary beams.

12. A charged particle beam application apparatus that detects a secondary beam of charged particles generated by irradiating a sample with a primary beam of charged particles, the charged particle beam application apparatus comprising:
a primary beam source that outputs a primary beam for radiating a sample;
a beam separator that includes a first electromagnetic pole unit and a second electromagnetic pole unit facing each other, and generates an internal electromagnetic field so that the primary beam travels straight, and a trajectory of the primary beam and a trajectory of the secondary beam are separated; and
a detector that detects the secondary beam from the beam separator,
wherein the first electromagnetic pole unit includes a first plate made of a magnetic material, the first plate extending along an optical axis of the primary beam,
wherein the second electromagnetic pole unit includes a second plate facing the first plate in a second direction perpendicular to the optical axis, the second plate being made of a magnetic material, and extending along the optical axis,
wherein a position of the optical axis in the second direction is between the first plate and the second plate in the second direction,
wherein the first plate includes first and second magnetic poles on a surface facing the second plate,
wherein the second plate includes third and fourth magnetic poles facing the first and second magnetic poles,
wherein the first and second magnetic poles extend along the optical axis and are arranged in a first direction perpendicular to the optical axis and the second direction,
wherein the third and fourth magnetic poles extend along the optical axis, are arranged in the first direction, and generate magnetic fields for the first and second magnetic poles, respectively,
wherein a potential applied to the second magnetic pole is higher than a potential applied to the first magnetic pole, and
wherein a potential applied to the fourth magnetic pole is higher than a potential applied to the third magnetic pole.

13. The charged particle beam application apparatus according to claim 12, further comprising:
an image shift deflector arranged between the sample and the beam separator; and
a swing-back deflector that is arranged between the image shift deflector and the beam separator, and swings back the secondary beam to the beam separator in association with image shift by the image shift deflector.

14. The charged particle beam application apparatus according to claim 12, further comprising a secondary optical system between the beam separator and the detector,
wherein the detector includes a plurality of sensors and is capable of simultaneously detecting a plurality of secondary beams from the sample.

15. The charged particle beam application apparatus according to claim 14, further comprising a divider that is arranged between the primary beam source and the beam separator, and divides the primary beam from the primary beam source into a plurality of primary beams.

\* \* \* \* \*